US012722245B2

(12) United States Patent
Yun et al.

(10) Patent No.: US 12,722,245 B2
(45) Date of Patent: Sep. 1, 2026

(54) POLISHING PAD, METHOD FOR PRODUCING THE SAME AND METHOD OF FABRICATING SEMICONDUCTOR DEVICE USING THE SAME

(71) Applicant: SK enpulse Co., Ltd., Gyeonggi-do (KR)

(72) Inventors: Jong Wook Yun, Seoul (KR); Eun Sun Joeng, Gyeonggi-do (KR); Sung Hoon Yun, Seoul (KR); Hye Young Heo, Gyeonggi-do (KR); Jang Won Seo, Seoul (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 844 days.

(21) Appl. No.: 17/693,031

(22) Filed: Mar. 11, 2022

(65) Prior Publication Data

US 2022/0288743 A1 Sep. 15, 2022

(30) Foreign Application Priority Data

Mar. 12, 2021 (KR) ........................ 10-2021-0032904

(51) Int. Cl.
*B24B 37/22* (2012.01)
*B24B 37/04* (2012.01)
*H10P 52/40* (2026.01)

(52) U.S. Cl.
CPC ............ *B24B 37/042* (2013.01); *B24B 37/22* (2013.01); *H10P 52/402* (2026.01)

(58) Field of Classification Search
CPC ....... B24B 37/042; B24B 37/22; B24B 37/20; B24B 37/11; B24B 37/24; B24B 37/107;
(Continued)

(56) References Cited

U.S. PATENT DOCUMENTS

2008/0242755 A1 10/2008 Kulp
2013/0303061 A1 11/2013 James et al.
2018/0311792 A1 11/2018 Qian et al.

FOREIGN PATENT DOCUMENTS

CN 109048646 A 12/2018
JP 2005-14188 A 1/2005
(Continued)

OTHER PUBLICATIONS

Machine Translation of KR-102197481-B1 (Year: 2020).*
(Continued)

*Primary Examiner* — Amber R Orlando
*Assistant Examiner* — Sarah Catherine Case
(74) *Attorney, Agent, or Firm* — IP & T GROUP LLP

(57) ABSTRACT

The present invention relates to a polishing pad, a method for producing the same, and a method of fabricating a semiconductor device using the same. According to the present invention, it is possible to prevent defects from occurring due to an inorganic component contained in a polishing layer during a polishing process, by limiting the content range of the inorganic component contained in the polishing layer. In addition, an unexpanded solid foaming agent is contained in a polishing composition for producing a polishing layer and is expanded during a curing process to form a plurality of uniform pores in the polishing layer, and the content range of the inorganic component contained in the polishing layer, thereby preventing defects from occurring during the polishing process.

11 Claims, 5 Drawing Sheets

(58) Field of Classification Search
CPC . B24B 37/26; B24B 37/044; H01L 21/30625; H01L 21/304; H01L 21/67092; B24D 3/32; B24D 11/001; B24D 3/04; B24D 18/00
See application file for complete search history.

(56) References Cited

FOREIGN PATENT DOCUMENTS

| | | | | |
|---|---|---|---|---|
| JP | 2006-104436 | A | | 4/2006 |
| JP | 2013-173945 | A | | 9/2013 |
| JP | 2013-237147 | A | | 11/2013 |
| JP | 2018-051645 | A | | 4/2018 |
| JP | 2018-174010 | A | | 11/2018 |
| JP | 2019-024078 | A | | 2/2019 |
| KR | 10-2013-0126521 | A | | 11/2013 |
| KR | 20180121840 | A | | 11/2018 |
| KR | 10-1949905 | B1 | | 2/2019 |
| KR | 10-2019-0029473 | A | | 3/2019 |
| KR | 10-2019-0135449 | A | | 12/2019 |
| KR | 102197481 | B1 | * | 12/2020 |
| TW | 201842963 | A | | 12/2018 |
| WO | 2020/254916 | A1 | | 12/2020 |

OTHER PUBLICATIONS

Written Opinion issued by IPOS for Application No. 10202202394P dated Jul. 24, 2023.

Search Report issued by IPOS for Application No. 10202202394P dated Jul. 6, 2023.

Extended European Search Report for the European Patent Application No. 22161518.0 issued by the European Patent Office on Jul. 22, 2022.

* cited by examiner

[FIG. 1]
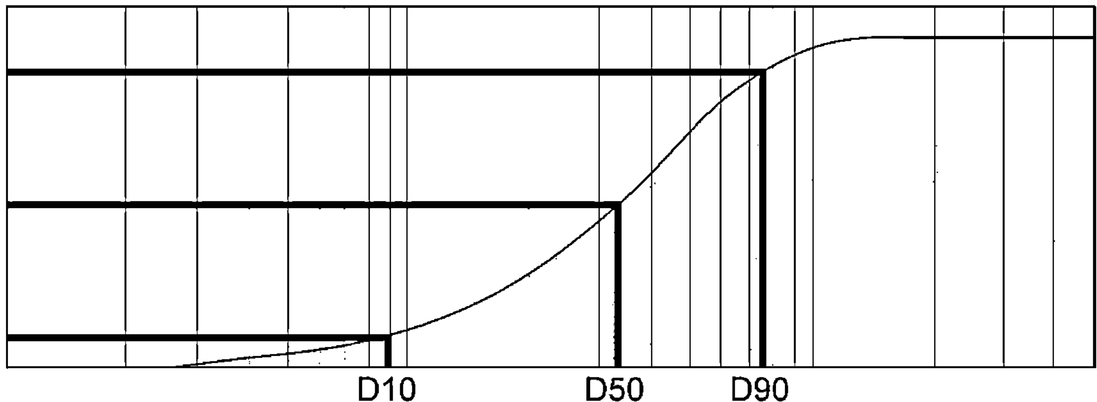
[FIG. 2]
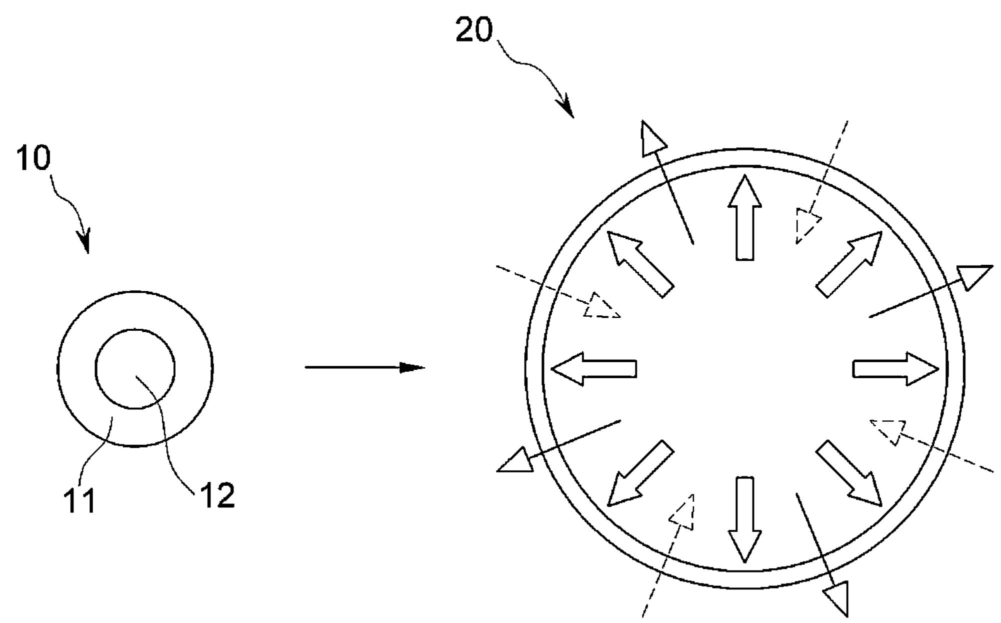

[FIG. 3]
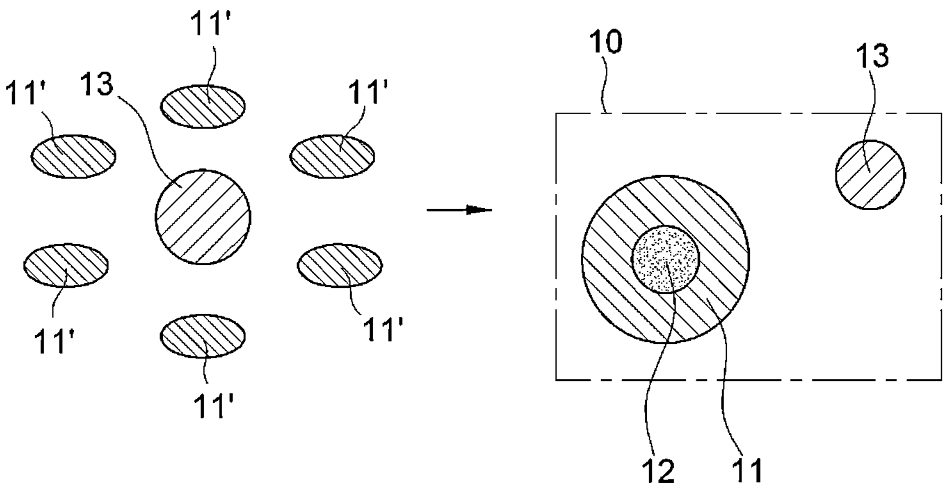
[FIG. 4]
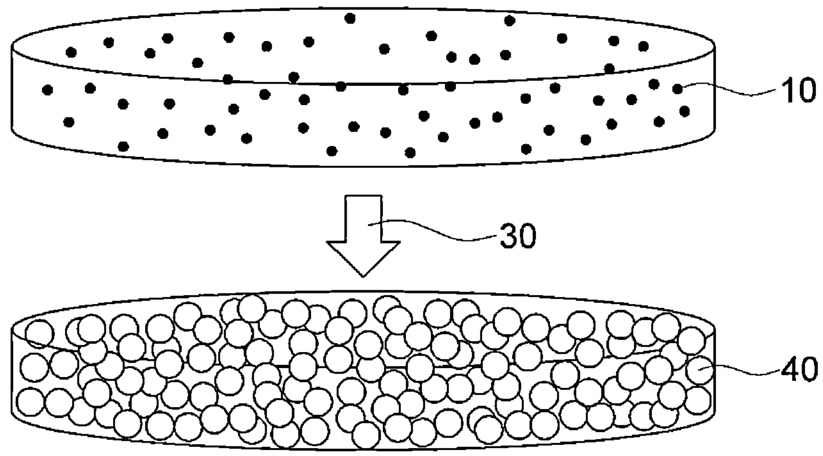

[FIG. 5]
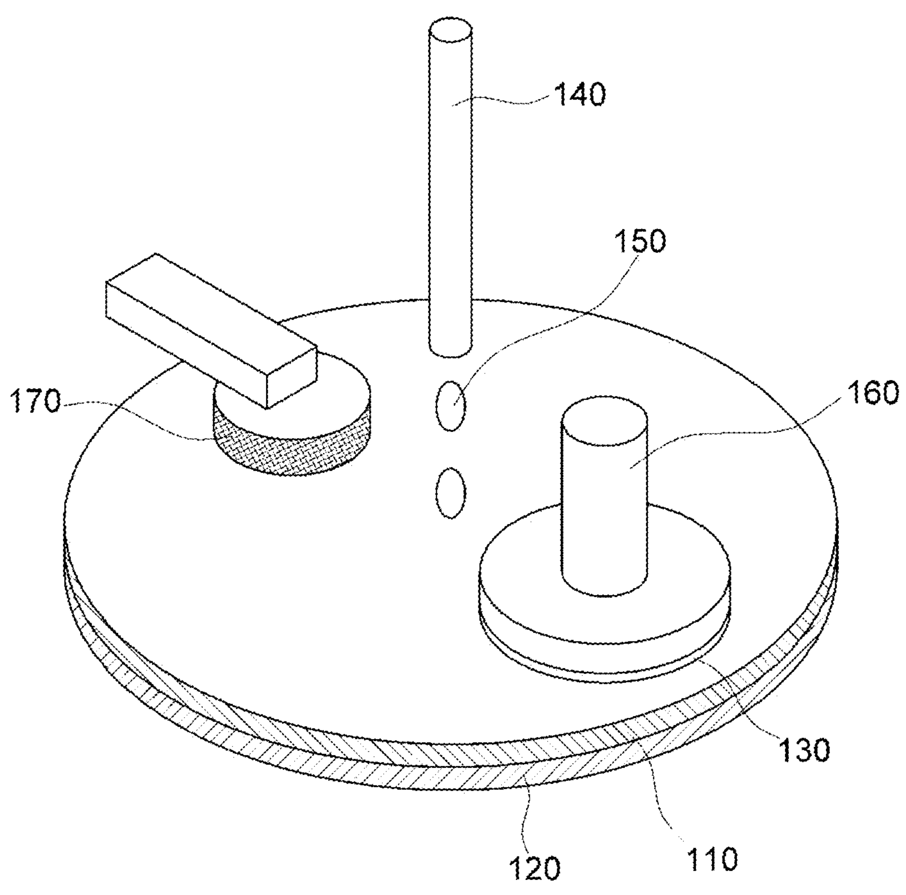
[FIG. 6]
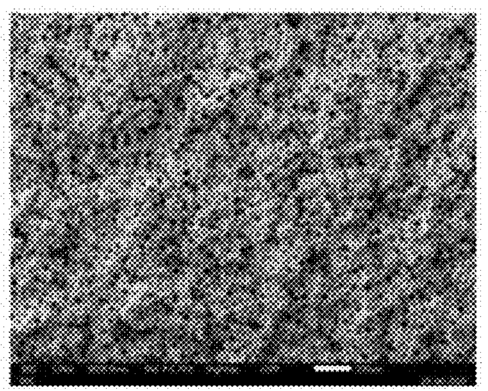

[FIG. 7]
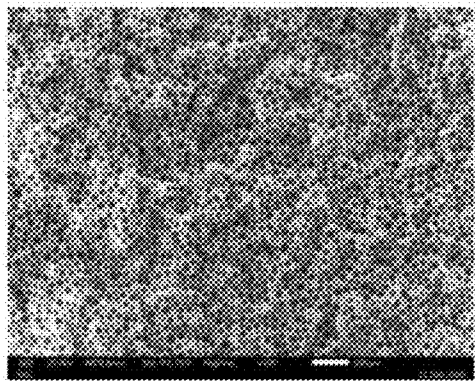
[FIG. 8]
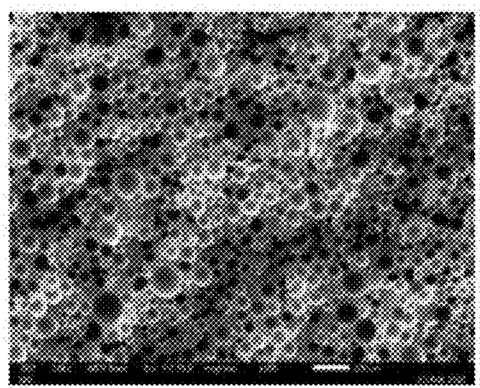
[FIG. 9]
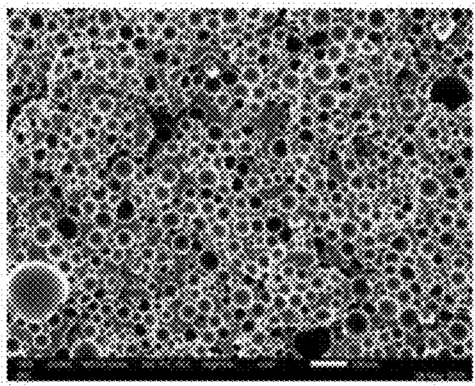

[FIG. 10]
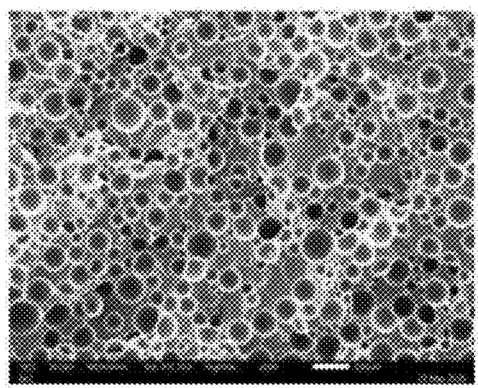

POLISHING PAD, METHOD FOR PRODUCING THE SAME AND METHOD OF FABRICATING SEMICONDUCTOR DEVICE USING THE SAME

CROSS-REFERENCE TO RELATED APPLICATION

This application claims priority to Korean Patent Application No. 10-2021-0032904, filed on Mar. 12, 2021, the disclosure of which is incorporated herein by reference in its entirety.

TECHNICAL FIELD

The present invention relates to a polishing pad for use in a chemical mechanical planarization (CMP) process, a method for producing the same, and a method of fabricating a semiconductor device using the same.

DESCRIPTION OF THE RELATED ART

Among semiconductor fabrication processes, a chemical mechanical planarization (CMP) process is a process that mechanically planarizes an uneven surface of a wafer by allowing a platen and a head to rotate relative to each other while subjecting the wafer surface to a chemical reaction by the supply of a slurry, in a state in which the wafer is attached to the head and brought into contact with the surface of a polishing pad formed on the platen.

As used herein, the term "dishing" refers to a phenomenon in which CMP polishing results in a metal recess in a low area, such as an oxide cavity or trough, where the metal layer should, but does not remain planar or coplanar with lower layers of the substrate wafer after CMP polishing.

The dishing problem has become more prominent in recent years as semiconductor wafers and devices are becoming increasingly complex, with finer features and more metallization layers. This trend requires improved performance from polishing consumables which are used in the polishing process to maintain planarity and limit polishing defects.

Defects in such wafers and devices can create electrical breaks or shorts in the conducting lines that would render the semiconductor device inoperative. To reduce polishing defects such as micro-scratches or chatter marks, a softer polishing pad may be used.

Furthermore, CMP polishing of soft metal layers may necessitate the use of softer CMP polishing pads to reduce polishing defects.

However, while CMP polishing with a soft pad can improve defectivity in substrates polished using such pads, such soft pads can increase dishing in metallized semiconductor wafer surfaces due to the flexible nature of the soft pad.

Accordingly, there is a need for development of a polishing pad which can not only reduce dishing on a substrate surface, which may occur due to the CMP polishing process for a metal surface in a semiconductor wafer or device substrate, but also minimize polishing defects that may occur in the wafer, and exhibit polishing performance suitable for the process.

SUMMARY

An object of the present invention is to provide a polishing pad, a method for producing the same, and a method of fabricating a semiconductor device using the same.

Another object of the present invention is to provide a polishing pad including a polishing layer, which prevents defects from occurring due to an inorganic component contained in the polishing layer during a polishing process, by limiting the content range of the inorganic component contained in the polishing layer.

Still another object of the present invention is to provide a method for producing a polishing pad, in which an unexpanded solid foaming agent is contained in a polishing composition for forming a polishing layer and expanded during a curing process to form a plurality of uniform pores in the polishing layer, and the content range of an inorganic component contained in the polishing layer is limited, thereby preventing defects from occurring during a polishing process.

Yet another object of the present invention is to provide a method of fabricating a semiconductor device using the polishing pad.

To achieve the above objects, a polishing pad according to one embodiment of the present invention includes a polishing layer, wherein the polishing layer contains: a plurality of micropores each having a shell; and an inorganic component, wherein the inorganic component is Mg and may be contained in an amount of less than 90 ppm based on the total weight of the polishing layer.

A method for producing a polishing pad according to another embodiment of the present invention includes steps of: i) preparing a prepolymer composition; ii) preparing a composition for producing a polishing layer containing the prepolymer composition, a foaming agent and a curing agent; and iii) producing a polishing layer by curing the composition for producing a polishing layer, wherein the polishing layer contains: a plurality of micropores each having a shell; and an inorganic component, wherein the inorganic component is Mg and may be contained in an amount of less than 90 ppm based on the total weight of the polishing layer.

A method for fabricating a semiconductor device according to still another embodiment of the present invention includes steps of: 1) providing a polishing pad including a polishing layer; and 2) polishing a semiconductor substrate while allowing the semiconductor substrate and the polishing layer to rotate relative to each other so that the polishing-target surface of the semiconductor substrate is in contact with the polishing surface of the polishing layer, wherein the polishing layer contains: a plurality of micropores each having a shell; and an inorganic component, wherein the inorganic component is Mg and may be contained in an amount of less than 90 ppm based on the total weight of the polishing layer.

Effects of the present invention are as follows. According to the present invention, it is possible to prevent defects from occurring due to the inorganic component contained in the polishing layer during the polishing process, by limiting the content range of the inorganic component contained in the polishing layer. In addition, an expandable solid foaming agent is contained in the polishing composition for producing a polishing layer and is expanded during a curing process to form a plurality of uniform pores in the polishing layer, and the content range of the inorganic component contained in the polishing layer is limited, thereby preventing defects from occurring during the polishing process.

The present invention may provide a method of fabricating a semiconductor device using the polishing pad.

BRIEF DESCRIPTION OF THE DRAWINGS

FIG. 1 is a graph showing volume cumulative diameters according to one embodiment of the present invention.

FIG. 2 is a conceptual view showing a solid foaming agent which is contained in a composition for producing a polishing layer according to one embodiment of the present invention.

FIG. 3 is a conceptual view showing the production of a solid foaming agent according to one embodiment of the present invention.

FIG. 4 is a conceptual view showing the foaming of the solid foaming agent during the production of the polishing layer according to one embodiment of the present invention.

FIG. 5 is a schematic process view showing a process for fabricating a semiconductor device according to one embodiment of the present invention.

FIG. 6 is a SEM image showing the pores of the polishing layer according to one embodiment of the present invention.

FIG. 7 is a SEM image showing the pores of the polishing layer according to one embodiment of the present invention.

FIG. 8 is a SEM image showing the pores of the polishing layer according to one embodiment of the present invention.

FIG. 9 is a SEM image showing the pores of the polishing layer according to one embodiment of the present invention.

FIG. 10 is a SEM image showing the pores of the polishing layer according to one embodiment of the present invention.

DESCRIPTION OF SPECIFIC EMBODIMENTS

Hereinafter, embodiments of the present invention will be described in detail so that those skilled in the art can easily carry out the present invention. However, the present invention may be embodied in a variety of different forms and is not limited to the embodiments described herein.

All numbers expressing quantities of components, properties such as molecular weights and reaction conditions, and so forth used in the present invention are to be understood as being modified in all instances by the term "about".

Unless otherwise stated herein, all percentages, parts, ratios, etc. are by weight.

In the present invention, it is understood that when any part is referred to "including" or "containing" any component, it may further include other components, rather than excluding other components, unless otherwise stated.

As used herein, "a plurality" refers to more than one.

In the present invention, "10% volume cumulative diameter", "50% volume cumulative diameter" and "90% volume cumulative diameter" refer to particle diameters representing 10%, 50% and 90% of the cumulative frequency distribution of the volume particle diameter, respectively. More specifically, as shown in FIG. 1, the Y-axis means the volume (%), and the X-axis means the diameter (μm). The cumulative frequency distribution of the pore volume depending on the pore diameter is obtained by dividing the sum of the volumes of pores having up to a certain diameter by the sum of the volumes of all pores as the diameter of the pores increases. That is, the 10% volume cumulative diameter means the largest diameter corresponding to when the volume obtained by cumulatively adding the volumes of pores having gradually larger diameters from the pores having the smallest diameter is 10%. In addition, the 50% volume cumulative diameter means the largest diameter corresponding to when the volume obtained by cumulatively adding the volumes of pores having gradually larger diameters from the pores having the smallest diameter is 50%. In addition, the 90% volume cumulative diameter means the largest diameter corresponding to when the volume obtained by cumulatively adding the volumes of pores having gradually larger diameters from the pores having the smallest diameter is 90%.

A polishing pad according to one embodiment of the present invention includes a polishing layer, wherein the polishing layer contains: a plurality of micropores each having a shell; and an inorganic component, wherein the inorganic component is Mg and may be contained in an amount of less than 100 ppm based on the total weight of the polishing layer.

The polishing layer of the polishing pad is produced by curing a urethane-based prepolymer, and a polishing process is performed using the cured organic compound. A composition for producing the polishing layer contains a foaming agent, and the foaming agent may be selected from the group consisting of a solid foaming agent, a gaseous foaming agent, and a mixture thereof.

The solid foaming agent is characterized by including a stabilizer, and the stabilizer is usually composed of an inorganic component. That is, the solid foaming agent requires the stabilizer for initial seed synthesis, and the stabilizer includes an inorganic material. The produced solid foaming agent is contained in a composition for producing the polishing layer, and at this time, the stabilizer is included in the solid foaming agent, and thus included in the polishing layer.

The stabilizer of the solid foaming agent contained in the polishing layer is composed of an inorganic component is an inorganic component that shows a higher strength than the polishing layer composed mainly of polyurethane, and thus causes defects or scratches in a semiconductor substrate during the polishing process.

Specifically, the polishing layer of the present invention has formed therein a plurality of micropores each having a shell, and contains an inorganic component provided by the solid foaming agent. The inorganic component is Mg and is contained in an amount of less than 90 ppm, specifically 0.01 to 90 ppm, preferably 0.01 to 10 ppm, more preferably 0.01 to 1 ppm, based on the total weight of the polishing layer.

The inorganic component Mg is a silvery-white light metal, and has a melting point of 650° C., a boiling point of 1090° C., which is the lowest among alkaline earth metals, and a density of 1.738 g/cm$^3$. Mg has a hexagonal packed crystal structure, is ductile and malleable, and thus can be drawn into a thin foil or a wire. In addition, it is used as a structural material because it is hard despite having low density. In particular, alloys of Mn with aluminum, zinc, manganese, iron, etc. are characterized by high hardness and excellent corrosion resistance despite having low density.

Said Mg is used as a stabilizer in the production of the solid foaming agent, is contained in the form of magnesium hydroxide ($Mg(OH)_2$) in the polishing layer without being removed during the process of producing the solid foaming agent, and thus causes defects in the polishing process as described above.

The polishing layer of the present invention is characterized in that the content range of Mg is limited within the above range in order to prevent defects from occurring due to Mg. By limiting the content of Mg within the above range, it is possible to prevent defects from occurring during the polishing process without affecting the polishing performance.

The occurrence of defects during the polishing process depending on the content of Mg in the polishing layer may be defined by the following Equation 1:

$$0 \leq \frac{DS \times D_{Mg}}{RR} \leq 1.5 \quad \text{[Equation 1]}$$

wherein

DS represents the number of defects and scratches, measured after performing the polishing process on a silicon oxide layer using a CMP polishing apparatus under a polishing load of 4.0 psi for 60 seconds while injecting a calcined ceria slurry at a rate of 250 ml/min and rotating a surface plate having the polishing pad attached thereto at a rotating speed of 150 rpm;

RR represents the removal rate (A/min) of the silicon oxide layer during the polishing process;

$D_{Mg}$ is the content (ppm) of Mg based on the total weight of the polishing layer; and $DS \times D_{Mg}/RR$ is the ratio between values excluding units.

Equation 1 relates to the number of defects generated in the semiconductor substrate by the polishing process and the content of Mg based on the total weight of the polishing layer. The number of defects generated during the polishing process and the content of Mg are in a proportional relationship, and thus as the content of Mg increases, the number of defects also increases.

However, since Mg contained in the polishing layer does not affect the polishing performance of the polishing layer, the removal rate of the silicon oxide layer, which corresponds to the denominator, is maintained within a certain range. Thus, when the value calculated by Equation 1 is included within the range of 0 to 1.5, it is possible to minimize defects, which are generated during the polishing process, without affecting the polishing performance.

Specifically, the removal rate (RR) in Equation 1 corresponds to a factor that may partially change depending on the performance of the polishing layer in the polishing pad, but is hardly affected by the content of Mg and is directly affected by the physical/mechanical properties of the polishing layer. When the physical/mechanical property values of polishing layers are similar, the denominator value in Equation 1 will fall within a similar range, and thus the value calculated by Equation 1 will be affected by the number of defects and the content of Mg, which constitute the numerator of Equation 1.

For a plurality of polishing pads, when the physical/mechanical properties of the polishing layers are similar, there is no significant difference in the denominator value between the polishing pads, only a difference in the content of Mg contained in the polishing layer appears, and the number of defects measured after the polishing process increases due to the content of Mg, and thus the numerator value becomes relatively large, resulting in a difference in the value calculated by Equation 1.

In the case of the polishing pad of the present invention, the value calculated by Equation 1 for the polishing layer is included within the range of 0 to 1.5, and thus the polishing performance is not affected, and the occurrence of defects during the polishing process can be minimized.

In a conventional method of producing a polishing layer in a polishing pad, pores having irregular sizes and arrangements are formed by a physical method or a chemical method. According to the conventional method of producing the polishing layer, pores having various shapes and sizes are arranged in an irregularly distributed form on the surface and inside the polishing layer made of a polymer material.

Among the conventional methods of forming pores or holes in the polishing layer, the physical method comprises mixing micro-sized materials with a material for forming the polishing layer. In this case, micro-sized materials with pores should be added in the initial stage of polishing layer production so that they mix well with the polymer.

However, in the physical method, it is difficult to allow the micro-sized materials to mix well uniformly with the polymer in the initial stage, and the sizes of the micro-sized materials are also not uniform.

In general, the average diameter of pores formed by the physical method is about 100 micrometers, and the diameter of each pore ranges from several tens of micrometers to several hundreds of micrometers. This is a phenomenon that occurs due to the limitations of the technology for making pores. In addition, since the distribution of pores changes depending on position due to gravity during the production of a polishing pad, it is not easy to produce a polishing layer having uniform performance.

The polishing layer produced using the physical method has a problem in that, because the size or distribution of pores formed therein is not uniform, the efficiency with which a semiconductor substrate is polished with high precision varies depending on the region being in contact with the polishing layer or time.

In the chemical method which is another method, pores may be formed on a CMP polishing pad, and the chemical method is performed using a phenomenon in which, when water or a liquid that can easily change into a gaseous state is added to a polymer solution and heated to a low temperature, pores are created while the liquid changes into a gas.

However, this method of forming pores in the polishing pad using a gas also has a problem in that it is difficult to maintain the pores at a uniform size.

A polishing pad is a consumable that is used to polish the surface of a semiconductor substrate, and is an indispensable important component. Slurry is present between the polishing pad and the surface of the semiconductor substrate during the polishing process and chemically and mechanically polishes the surface of the semiconductor substrate during the polishing process, and the used slurry is discharged to the outside.

The polishing pad must be able to store the slurry so that the slurry is present on the polishing pad for a predetermined period of time. This slurry storage function of the polishing pad may be performed by the pores or grooves formed in the polishing pad.

That is, the slurry penetrates into the pores or grooves formed in the polishing pad and efficiently polishes the surface of the semiconductor substrate for a long time. In order for the polishing pad to suppress the outflow of the slurry as much as possible and to exhibit good polishing efficiency, the shape of the pores or grooves must be well controlled, and the optimal physical properties of the polishing pad, such as hardness, must be able to be maintained.

Accordingly, a plurality of pores formed in the polishing layer of the polishing pad of the present invention are controlled to a predetermined size, making it possible to prevent defects from occurring during the polishing process.

More specifically, a plurality of micropores each having a shell are formed in the polishing layer and have a value of 0.7 to 0.8 as calculated according to the following Equation 2:

$$\frac{D10}{D50} \quad \text{[Equation 2]}$$

wherein

D10 is the diameter of the pores in the 10% volume cumulative distribution, and

D50 is the diameter of the pores in the 50% volume cumulative distribution.

Equation 2 above means the ratio of the 10% volume cumulative diameter to the 50% volume cumulative diameter of the pores.

When measuring the volume cumulative diameters, D10 means the diameter value of the pores corresponding to the 10% volume, and as the value of the number following D increases, the diameter of the pores increases.

As described above, the value calculated by Equation 2 is 0.7 to 0.8, or preferably 0.70 to 0.75, which means that pores with a uniform size distribution are formed. Since the size distribution of the formed pores is uniform, it is possible to prevent the occurrence of defects in the semiconductor substrate without affecting the removal rate and the cut rate during the polishing process.

In addition, the micropores in the polishing layer have a standard deviation of 4 to 10 for the measured values of D10 to D100. Specifically, the values obtained by calculating the standard deviations of D10, D20, D30, D40, D50, D60, D70, D80 and D90 values, which are the volume cumulative diameter values of the pores, may be 4 to 10, more specifically 4.5 to 9.5. This means that, when measuring the volume cumulative diameter, the diameter increases as the cumulative volume value increases, but the degree of increase in the diameter is not significant, and means that a plurality of pores having a uniform size are formed in the polishing layer of the present invention.

The D50 of the pores formed in the polishing layer may be 15 to 40 μm, preferably 18 to 25 μm. Considering that the D50 of the pores formed in the polishing layer in a conventional polishing pad is measured to be 30 to 45 μm, it can be seen that the pores formed in the polishing layer of the present invention have a small diameter distribution.

That is, when the polishing layer is produced by molding a cured product obtained by curing a composition containing a polyurethane-based prepolymer, a curing agent and a foaming agent, and the produced polishing layer is characterized in that a plurality of pores are formed therein.

As described above, the physical method or the chemical method is used to form pores in the polishing layer, and the chemical method has recently been used for the production of the polishing layer.

That is, pores are formed by injecting a liquid foaming agent or gas as the foaming agent, but in the case of the above method, the liquid foaming agent is vaporized during the curing process to form pores, and thus it is not easy to control the size of the formed pores. In addition, even when the gas is injected, it is not easy to control the pore size when forming pores.

The foaming agent that is used in the production of the polishing layer of the present invention is a solid foaming agent. More specifically, the solid foaming agent is expandable particles or expanded particles, and any solid foaming agent may be used without limitation.

Among the solid foaming agents, the unexpanded particles remain in an expandable state when contained in the composition for producing a polishing layer, and may then be expanded during a curing process for producing a polishing layer to form a plurality of pores in the polishing layer. The expanded particles mean that they remain in an expanded state when contained in the composition for producing a polishing layer.

Hereinafter, expandable particles will be described in more detail. FIG. 2 shows an expandable particle 10. The expandable particle 10 may include: a shell 11 made of a resin material, and an expansion-inducing component 12 enclosed inside the shell.

The expandable particles 10 are non-pre-expanded particles, and refer to a particle whose final size is determined by expansion caused by the heat or pressure applied during the process of producing the polishing layer.

The expandable particles 10 may be foamed by a curing process to form a plurality of pores in the polishing layer. The foaming agent of the present invention may include expandable particles as the foaming agent 10, and may be expanded (indicated by reference numeral 20) using the expandable particles 10 during the curing process to form a plurality of pores.

The expandable particle 10 may include: a shell 11 made of a resin material; and an expansion-inducing component 12 enclosed inside the shell.

For example, the shell 11 may include a thermoplastic resin, and the thermoplastic resin may be at least one selected form the group consisting of a vinylidene chloride-based copolymer, an acrylonitrile-based copolymer, a methacrylonitrile-based copolymer, and an acrylic copolymer.

The expansion-inducing component 12 may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

Specifically, the expandable particle 10 includes a shell 11 made of a thermoplastic resin and a hydrocarbon gas 12 enclosed inside the shell. The hydrocarbon gas serves to expand the thermoplastic shell by the heat applied during the curing process.

As described above, when the size of the polymer shell is increased by expansion as described above and the hydrocarbon gas enclosed inside the shell flows out, pores are formed in the polishing layer, and thus the polymer shells are included in the polishing layer.

In addition, as described above, the expandable particles 10 are produced by polymerizing thermoplastic resin 11' into the shells 11 using the inorganic material stabilizer 13 as shown in FIG. 3. When the thermoplastic resin 11' is polymerized by the stabilizer 13 to produce spherical expandable particles 10, the shell 11 is formed by polymerization of the thermoplastic resin 11' and the hydrocarbon gas 12 is enclosed therein.

The expandable particles 10 produced by the method shown in FIG. 3 are used as a foaming agent for producing the polishing layer, and, as described above, the expandable particles 10 together with the stabilizer 13 are included in the polishing layer.

The diameter of the expandable particles before foaming is 9 to 24 μm, preferably 9 to 15 μm, the expansion start temperature thereof is 80 to 120° C., and the maximum temperature thereof for foaming may be 120 to 170° C. In addition, the solid foaming agent including the expandable particles may be acidic or basic, but preferably has a pH of 8 or less, more preferably 3 to 4.

The expandable particles show a difference in size after foaming depending on the diameter of the particles before foaming, and may exhibit a large difference in the standard deviations for D10 to D100. That is, a solid foaming agent having a particle diameter of 9 to 15 μm before foaming, an expansion start temperature of 80 to 120° C., a maximum temperature for foaming of 120 to 170° C., and a pH of 3 to 4, is used, a plurality of pores formed in the polishing layer have a small size and a uniform diameter distribution, and thus it is possible to prevent the occurrence of defects in a semiconductor substrate without affecting the polishing rate and the cutting rate during the polishing process.

When expandable particles not included within the above ranges are used as a solid foaming agent, a plurality of pores formed in the polishing layer after production of the polishing layer have a large diameter and a non-uniform diameter distribution, and thus the number of defects generated during the polishing process increases.

The content of the solid foaming agent may be 0.5 parts by weight to 10 parts by weight, for example, 1 part by weight to 7 parts by weight, for example, 1 part by weight to 5 parts by weight, based on 100 parts by weight of the urethane-based prepolymer. The type and content of the solid foaming agent may be designed depending on the desired pore structure and physical properties of the polishing layer.

A composition for producing the polishing layer of the present invention may contain, in addition to the above-described expandable solid foaming agent, one selected from the group consisting of an expanded solid foaming agent, a gaseous foaming agent, a liquid foaming agent, and combinations thereof.

The gaseous foaming agent may include an inert gas. The gaseous foaming agent may be used as a pore-forming element which is added during a reaction between the urethane-based prepolymer and the curing agent.

The type of inert gas is not particularly limited as long as it does not participate in the reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gaseous foaming agent may be designed depending on the desired pore structure and physical properties of the polishing layer.

The thermally expanded particles of the solid foaming agent may be particles having an average particle diameter of about 5 μm to about 100 μm. The average particle diameter of the thermally expanded particles may be about 5 μm to about 80 μm, for example, about 10 μm to about 70 μm, for example, about 10 μm to about 60 μm, for example, about 10 μm to about 50 μm, for example, about 10 μm to about 30 μm, for example, about 15 μm to 30 μm, for example, about 15 μm to about 25 μm. The average particle diameter is defined as the D50 of the thermally expanded particles.

In one embodiment, the density of the thermally expanded particles may be about 30 $kg/m^3$ to about 80 $kg/m^3$, for example, about 35 $kg/m^3$ to about 80 $kg/m^3$, for example, about 35 $kg/m^3$ to about 75 $kg/m^3$, for example about 38 $kg/m^3$ to about 72 $kg/m^3$, for example, about 40 $kg/m^3$ to about 75 $kg/m^3$, for example, 40 $kg/m^3$ to about 72 $kg/m^3$.

In one embodiment, the foaming agent may include a gaseous foaming agent. For example, the foaming agent may include a solid foaming agent and a gaseous foaming agent.

Details regarding the solid foaming agent are as described above. The gaseous foaming agent may include nitrogen gas.

The gaseous foaming agent may be injected through a predetermined injection line in the process in which the urethane-based prepolymer, the solid foaming agent and the curing agent are mixed together. The injection rate of the gaseous foaming agent may be about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, for example, about 1.0 L/min to about 1.7 L/min.

In one embodiment, the polishing layer may include a polishing layer including a cured product formed from a composition containing a urethane-based prepolymer, a curing agent, and a foaming agent. The foaming agent is as described above, and thus description thereof will be excluded from the following description.

Each component contained in the composition will be described in detail below.

The term "prepolymer" refers to a polymer with a relatively low molecular weight, the polymerization of which has been stopped in an intermediate step in the production of a cured product so as to facilitate molding. The prepolymer may be formed directly into a final cured product or may be formed into a final cured product after reaction with another polymerizable compound.

In one embodiment, the urethane-based prepolymer may be produced by allowing an isocyanate compound to react with a polyol.

The isocyanate compound that is used in the production of the urethane-based prepolymer may be one selected from the group consisting of an aromatic diisocyanate, an aliphatic diisocyanate, an alicyclic diisocyanate, and combinations thereof.

The isocyanate compound may include, for example, one selected from the group consisting of 2,4-toluene diisocyanate (2,4-TDI), 2,6-toluene diisocyanate (2,6-TDI) naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, isoporone diisocyanate, and combinations thereof.

The term "polyol" refers to a compound containing at least two hydroxyl groups (—OH) per molecule. The polyol may include, for example, one selected from the group consisting of a polyether polyol, a polyester polyol, a polycarbonate polyol, an acrylic polyol, and combinations thereof.

The polyol may include, for example, one selected from the group consisting of polytetramethylene ether glycol, polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and combinations thereof.

The polyol may have a weight-average molecular weight (Mw) of about 100 g/mol to about 3,000 g/mol. For example, the polyol may have a weight-average molecular weight (Mw) of about 100 g/mol to about 3,000 g/mol, for example, about 100 g/mol to about 2,000 g/mol, about 100 g/mol to about 1,800 g/mol.

In one embodiment, the polyol may include a low-molecular-weight polyol having a weight average molecular weight (Mw) of about 100 g/mol to less than about 300 g/mol, and a high-molecular-weight polyol having a weight-average molecular weight (Mw) of about 300 g/mol to about 1,800 g/mol.

The urethane-based prepolymer may have a weight-average molecular weight (Mw) of about 500 g/mol to about 3,000 g/mol. The urethane-based prepolymer may have a weight-average molecular weight (Mw) of, for example, about 600 g/mol to about 2,000 g/mol, for example, about 800 g/mol to about 1,000 g/mol.

In one embodiment, the isocyanate compound for producing the urethane-based prepolymer may include an aromatic diisocyanate compound. For example, the aromatic diisocyanate compound may include, for example, 2,4-toluene diisocyanate (2,4-TDI) and 2,6-toluenediisocyanate (2,6-TDI). In addition, the polyol compound for producing the urethane-based prepolymer may include, for example, polytetramethylene ether glycol (PTMEG) and diethylene glycol (DEG).

In another embodiment, the isocyanate compound for producing the urethane-based prepolymer may include an aromatic diisocyanate compound and an alicyclic diisocyanate compound. For example, the aromatic diisocyanate compound may include 2,4-toluene diisocyanate (2,4-TDI) and 2,6-toluene diisocyanate (2,6-TDI), and the alicyclic diisocyanate compound may include dicyclohexylmethanediisocyanate (H12MDI). In addition, the polyol compound for producing the urethane-based prepolymer may include, for example, polytetramethylene ether glycol (PTMEG) and diethylene glycol (DEG).

The urethane-based prepolymer may have an isocyanate end group content (NCO %) of about 5 wt % to about 11 wt %, for example, about 5 wt % to about 10 wt %, for example, about 5 wt % to about 8 wt %, for example, about 8 wt % to about 10 wt %. When the urethane-based prepolymer has NCO % within the above range, the polishing layer of the polishing pad may exhibit appropriate properties and maintain polishing performance required for the polishing process, such as removal rate and polishing profile, and it is possible to minimize defects that may occur on the wafer during the polishing process.

In addition, it is possible to control the polishing selectivity between oxide and nitride (oxide removal rate/nitride removal rate; Ox RR/Nt RR), thus preventing dishing, recess and erosion phenomena and achieving wafer surface planarization.

The isocyanate end group content (NCO %) of the urethane-based prepolymer may be designed by comprehensively controlling the types and contents of the isocyanate compound and polyol compound for producing the urethane-based prepolymer, process conditions such as the temperature, pressure and time of the process for producing the urethane-based prepolymer, and the types and contents of additives that are used in the production of the urethane-based prepolymer.

The curing agent is a compound that chemically reacts with the urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline (MOCA), diethyltoluenediamine (DETDA), diaminodiphenylmethane, dimethyl thio-toluene diamine (DMTDA), propanediol bis-p-aminobenzoate, methylene bis-methylanthranilate, diaminodiphenylsulfone, m-xylylenediamine, isophoronediamine, ethylenediamine, diethylenetriamine, triethylenetetramine, polypropylenediamine, polypropylenetriamine, bis(4-amino-3-chlorophenyl)methane, and combinations thereof.

The content of the curing agent may be about 18 parts by weight to about 27 parts by weight, for example, about 19 parts by weight to about 26 parts by weight, for example, about 20 parts by weight to about 26 parts by weight, based on 100 parts by weight of the urethane-based prepolymer. When the content of the curing agent satisfies the above range, it may more advantageously realize the desired performance of the polishing pad.

The composition for producing the polishing layer may further contain other additives such as a surfactant and a reaction rate controller. The names such as "surfactant" and "reaction rate controller" are arbitrary names given based on the main function of the corresponding substance, and each corresponding substance does not necessarily perform only a function limited to the function indicated by the corresponding name.

The surfactant is not particularly limited as long as it is a material that serves to prevent aggregation or overlapping of pores. For example, the surfactant may include a silicone-based surfactant.

The surfactant may be used in an amount of about 0.2 parts by weight to about 2 parts by weight based on 100 parts by weight of the urethane-based prepolymer. Specifically, the surfactant may be contained in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to 1.5 parts by weight, based on 100 parts by weight of the urethane-based prepolymer. When the surfactant is contained in an amount within the above range, pores derived from the gaseous foaming agent may be stably formed and maintained in the mold.

The reaction rate controller serves to accelerate or retard the reaction, and depending on the purpose thereof, may include a reaction accelerator, a reaction retarder, or both. The reaction rate controller may include a reaction accelerator. For example, the reaction accelerator may be at least one reaction accelerator selected from the group consisting of a tertiary amine-based compound and an organometallic compound.

Specifically, the reaction rate controller may include at least one selected from the group consisting of triethylenediamine, dimethyl ethanol amine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbonene, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controller may include at least one selected from the group consisting of benzyldimethylamine, N,N-dimethylcyclohexylamine, and triethylamine.

The reaction rate controller may be used in an amount of about 0.05 parts by weight to about 2 parts by weight based on 100 parts by weight of the urethane-based prepolymer. Specifically, the reaction rate controller may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, parts, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to about 1 part by weight, based on 100 parts by weight of the urethane-based prepolymer. When the reaction rate controller is used in an amount within the above-described content range, it is possible to appropriately control the curing reaction rate of the prepolymer composition to form a polishing layer having pores of a desired size and having a desired hardness.

When the polishing pad includes a cushion layer, the cushion layer may serve to absorb and disperse an external impact applied to the polishing layer while supporting the polishing layer, thereby minimizing the occurrence of damage to the polishing target and defects thereon during the polishing process performed using the polishing pad.

The cushion layer may include, but is not limited to, non-woven fabric or suede.

In one embodiment, the cushion layer may be a resin-impregnated nonwoven fabric. The nonwoven fabric may be a fiber nonwoven fabric including one selected from the group consisting of polyester fibers, polyamide fibers, polypropylene fibers, polyethylene fibers, and combinations thereof.

The resin impregnated into the nonwoven fabric may include one selected from the group consisting of polyurethane resin, polybutadiene resin, styrene-butadiene copolymer resin, styrene-butadiene-styrene copolymer resin, acrylonitrile-butadiene copolymer resin, styrene-ethylene-butadiene-styrene copolymer resin, silicone rubber resin, polyester-based elastomer resin, polyamide-based elastomer resin, and combinations thereof.

Hereinafter, a method for producing the polishing pad will be described in detail.

In another embodiment of the present invention, there may be provided a method for producing a polishing pad, the method including steps of: preparing a prepolymer composition; preparing a composition for producing a polishing layer containing the prepolymer composition, a foaming agent and a curing agent; and producing a polishing layer by curing the composition for producing a polishing layer.

The step of preparing the preliminary composition may be a process of producing a urethane-based prepolymer by reacting a diisocyanate compound with a polyol compound. Details regarding the diisocyanate compound and the polyol compound are as described above with respect to the polishing pad.

The isocyanate group content (NCO %) of the preliminary composition may be about 5 wt % to about 15 wt %, for example, about 5 wt % to about 8 wt %, for example, 5 wt % to 7 wt %, for example, 8 wt % to 15 wt %, for example, about 8 wt % to about 14 wt %, for example, about 8 wt % to about 12 wt %, for example, 8 wt % to about 10 wt %.

The isocyanate group content of the prepolymer composition may be derived from the terminal isocyanate groups of the urethane-based prepolymer, the unreacted isocyanate groups in the diisocyanate compound, and the like.

The viscosity of the prepolymer composition may be about 100 cps to about 1,000 cps, for example, about 200 cps to about 800 cps, for example, about 200 cps to about 600 cps, for example, about 200 cps to about 550 cps, for example, about 300 cps to about 500 cps, at about 80° C.

The foaming agent may be included as an expandable solid foaming agent as described above, and a foaming agent selected from the group consisting of an expanded solid foaming agent, a liquid foaming agent, a gaseous foaming agent, and mixtures thereof may be used in combination with the expandable solid foaming agent.

For example, the foaming agent may include: an expandable solid foaming agent and an expanded solid foaming agent; or an expandable solid foaming agent, an expanded solid foaming agent and a gaseous foaming agent; or an expandable solid foaming agent and a liquid foaming agent; or an expandable solid foaming agent, a liquid foaming agent and a gaseous foaming agent; or an expandable solid foaming agent, an expanded solid foaming agent, a liquid foaming agent and a gaseous foaming agent. The foaming agent includes an expandable solid foaming agent, and the type and content of the foaming agent may be designed depending on the desired pore structure and physical properties of the polishing layer.

When the foaming agent includes a solid foaming agent, the step of preparing the composition for producing a polishing layer may include steps of: preparing a first preliminary composition by mixing the prepolymer composition and the solid foaming agent; and preparing a second preliminary composition by mixing the first preliminary composition and a curing agent.

The viscosity of the first preliminary composition may be about 1,000 cps to about 2,000 cps, for example, about 1,000 cps to about 1,800 cps, for example, about 1,000 cps to about 1,600 cps, for example, about 1,000 cps to about 1,500 cps, at about 80° C.

When the foaming agent includes a gaseous foaming agent, the step of preparing the composition for producing a polishing layer may include steps of: preparing a third preliminary composition containing the prepolymer composition and the curing agent; and preparing a fourth preliminary composition by injecting the gaseous foaming agent into the third preliminary composition.

In one embodiment, the third preliminary composition may further contain a solid foaming agent.

In one embodiment, the process of producing a polishing layer may include steps of: preparing a mold preheated to a first temperature; injecting and curing the composition for producing a polishing layer into the preheated mold; and post-curing the cured composition for producing a polishing layer at a second temperature higher than the preheating temperature.

In one embodiment, the first temperature may be about 60° C. to about 100° C., for example, about 65° C. to about 95° C., for example, about 70° C. to about 90° C.

In one embodiment, the second temperature may be about 100° C. to about 130° C., for example, about 100° C. to 125° C., for example, about 100° C. to about 120° C.

The step of curing the composition for producing a polishing layer at the first temperature may be performed for about 5 minutes to about 60 minutes, for example, about 5 minutes to about 40 minutes, for example, about 5 minutes to about 30 minutes, for example, about 5 minutes to about 25 minutes.

The step of post-curing the composition (cured at the first temperature) for producing a polishing layer at the second temperature may be performed for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The solid foaming agent of the present invention is expandable particles, and the expandable particles contained in the composition for producing a polishing layer may be expanded by the heat and pressure provided during the curing process to form a plurality of pores in the polishing layer.

Specifically, as shown in FIG. 4, when the composition for producing a polishing layer is injected into a preheated mold and subjected to a curing process 30, expandable particles 10 contained in the composition for producing a polishing layer are expanded to form a plurality of pores 40.

The method of producing a polishing pad may include a step of processing at least one surface of the polishing layer. The processing step may include forming grooves.

In another embodiment, the step of processing at least one surface of the polishing layer may include at least one of steps of: (1) forming grooves on at least one surface of the polishing layer; (2) line-turning at least one surface of the polishing layer; and (3) roughening at least one surface of the polishing layer.

In step (1), the grooves may include at least one of concentric grooves formed from the center of the polishing layer so as to be spaced apart from each other at a predetermined distance, and radial grooves continuously connected from the center of the polishing layer to the edge of the polishing layer.

In step (2), the line turning may be performed by a method of cutting the polishing layer by a predetermined thickness by means of a cutting tool.

The roughening in step (3) may be performed by a method of processing the surface of the polishing layer with sanding rollers.

The method of producing a polishing pad may further include a step of laminating a cushion layer on a surface opposite to the polishing surface of the polishing layer.

The polishing layer and the cushion layer may be laminated to each other through a heat-sealing adhesive.

The heat-sealing adhesive may be applied onto a surface opposite to the polishing surface of the polishing layer, and the heat-sealing adhesive may be applied onto the surface to be in contact with the polishing layer of the cushion layer. The polishing layer and the cushion layer may be laminated to each other in such a manner that the surfaces to which the heat-sealing adhesive has been applied come into contact with each other, and then the two layers may be laminated to each other using a pressure roller.

A method for fabricating a semiconductor device according to another embodiment of the present invention includes steps of: providing a polishing pad including a polishing layer; and polishing a polishing target while allowing the polishing target and the polishing pad to rotate relative to each other so that the polishing-target surface of the polishing target is in contact with the polishing surface of the polishing layer.

FIG. 5 is a schematic view showing a process for fabricating a semiconductor device according to one embodiment of the present invention. Referring to FIG. 5, a polishing pad 110 according to the embodiment is placed on a surface plate 120, and then a semiconductor substrate 130 which is a polishing target is disposed on the polishing pad 110. At this time, the polishing target surface of the semiconductor substrate 130 is in direct contact with the polishing surface of the polishing pad 110. For polishing, a polishing slurry 150 may be sprayed onto the polishing pad through a nozzle 140. The flow rate of the polishing slurry 150 that is supplied through the nozzle 140 may be selected within the range of about 10 $cm^3$/min to about 1,000 $cm^3$/min depending on purpose, and may be, for example, about 50 $cm^3$/min to about 500 $cm^3$/min, but is not limited thereto. The polishing slurry 150 may include a calcined ceria slurry, a silica slurry, or the like. Preferably, the polishing slurry 150 may include a calcined ceria slurry. However, the type of polishing slurry 150 is not limited to the above example and may be variously changed.

Thereafter, the semiconductor substrate 130 and the polishing pad 110 may rotate relative to each other, so that the surface of the semiconductor substrate 130 may be polished. In this case, the rotating direction of the semiconductor substrate 130 and the rotating direction of the polishing pad 110 may be the same direction or may be opposite to each other. The rotating speed of each of the semiconductor substrate 130 and the polishing pad 110 may be selected within the range of about 10 rpm to about 500 rpm depending on the purpose, and may be, for example, about 30 rpm to about 200 rpm, but is not limited thereto.

The semiconductor substrate 130 may come into contact with the polishing surface of the polishing pad 110 by pressing with a predetermined load in a state in which it is supported by a polishing head 160, and then the surface thereof may be polished. The load under which the polishing target surface of the semiconductor substrate 130 is pressed onto the polishing surface of the polishing pad 110 by a polishing head 160 may be selected within the range of about 1 gf/$cm^2$ to about 1,000 gf/$cm^2$ depending on the purpose, and may be, for example, about 10 gf/$cm^2$ to about 800 gf/$cm^2$, but is not limited thereto.

In one embodiment, the method for fabricating a semiconductor device may further include a step of processing the polishing surface of the polishing pad 110 by a conditioner 170 at the same time as polishing of the semiconductor substrate 130 in order to maintain the polishing surface of the polishing pad 110 in a state suitable for polishing.

Hereinafter, specific examples of the present invention will be presented. However, the examples described below serve merely to illustrate or explain the present invention in detail, and the scope of the present invention should not be limited thereto.

Example 1

Production of Polishing Pad

TDI, $H_{12}$MDI, polytetramethylene ether glycol and diethylene glycol were added to a four-neck flask and allowed to react at 80° C. for 3 hours, thereby producing a prepolymer having an NCO % of 8 to 12%.

For the production of a polishing layer (top pad), in a casting machine including lines for introducing a prepolymer, a curing agent, an inert gas and a liquid foaming agent, the prepared prepolymer and a catalyst were introduced into a prepolymer tank. At this time, the catalyst (triethyl amine) was introduced in an amount of 0.002 parts by weight based on 100 parts by weight of the prepolymer. In addition, bis(4-amino-3-chlorophenyl)methane (Ishihara Corp.) was introduced into a curing agent tank.

As a foaming agent, an expandable solid foaming agent (Akzonobel Corp., 551DU40) was used and premixed with the prepolymer.

During casting, the equivalents of the prepolymer and the curing agent were adjusted to 1:1, and the prepolymer and the curing agent were discharged at a rate of 10 kg/min. In addition, the inert gas nitrogen ($N_2$) was injected in an amount corresponding to a predetermined volume % based on the total flow amount. The injected raw materials were mixed together at a high speed (rpm) in a mixing head, and then injected into a mold (width: 1,000 mm, length: 1,000 mm, and height: 3 mm) preheated to 100° C., thereby producing a sheet for a polishing layer. The produced sheet for a polishing layer had a density of 0.7 to 0.9 and included a plurality of pores formed therein. After the sheet for a polishing layer was subjected to surface milling, the tensile strength, elongation, and pore diameter (pore size) of the polishing layer itself were measured. Next, a CMP pad was produced by subjecting the polishing layer to a grooving process and a lamination process, and then the CMP polishing performance thereof was evaluated.

Example 2

TDI, $H_{12}$MDI, polytetramethylene ether glycol and diethylene glycol were added to a four-neck flask and allowed to react at 80° C. for 3 hours, thereby producing a prepolymer having an NCO % of 8 to 12%.

For the production of a polishing layer (top pad), in a casting machine including lines for introducing a prepolymer, a curing agent, an inert gas and a liquid foaming agent, the prepared prepolymer and a catalyst were introduced into a prepolymer tank. At this time, the catalyst (triethyl amine) was introduced in an amount of 0.001 parts by weight based on 100 parts by weight of the prepolymer. In addition, bis(4-amino-3-chlorophenyl)methane (Ishihara Corp.) was introduced into a curing agent tank.

As a foaming agent, an expandable solid foaming agent (Akzonobel Corp., 461DU40) was used and premixed with the prepolymer.

During casting, the equivalents of the prepolymer and the curing agent were adjusted to 1:1, and the prepolymer and the curing agent were discharged at a rate of 10 kg/min. In addition, the inert gas nitrogen ($N_2$) was injected in an amount corresponding to a predetermined volume % based on the total flow amount. The injected raw materials were mixed together at a high speed (rpm) in a mixing head, and then injected into a mold (width: 1,000 mm, length: 1,000 mm, and height: 3 mm) preheated to 100° C., thereby producing a sheet for a polishing layer. The produced sheet for a polishing layer had a density of 0.7 to 0.9 and included a plurality of pores formed therein. After the sheet for a polishing layer was subjected to surface milling, the tensile strength, elongation, and pore diameter (pore size) of the polishing layer itself were measured. Next, a CMP pad was produced by subjecting the polishing layer to a grooving process and a lamination process, and then the CMP polishing performance thereof was evaluated.

Comparative Example 1

TDI, $H_{12}$MDI, polytetramethylene ether glycol and diethylene glycol were added to a four-neck flask and allowed to react at 80° C. for 3 hours, thereby producing a prepolymer having an NCO % of 8 to 12%.

For the production of a polishing layer (top pad), in a casting machine including lines for introducing a prepolymer, a curing agent, an inert gas and a liquid foaming agent, the prepared prepolymer was introduced into a prepolymer tank. In addition, bis(4-amino-3-chlorophenyl)methane (Ishihara Corp.) was introduced into a curing agent tank.

As a foaming agent, an expandable solid foaming agent (Akzonobel Corp., 031DU40) was used and premixed with the prepolymer.

During casting, the equivalents of the prepolymer and the curing agent were adjusted to 1:1, and the prepolymer and the curing agent were discharged at a rate of 10 kg/min. The injected raw materials were mixed together at a high speed (rpm) in a mixing head, and then injected into a mold (width: 1,000 mm, length: 1,000 mm, and height: 3 mm) preheated to 100° C., thereby producing a sheet for a polishing layer. The produced sheet for a polishing layer had a density of 0.7 to 0.9 and included a plurality of pores formed therein. After the sheet for a polishing layer was subjected to surface milling, the tensile strength, elongation, and pore size of the polishing layer itself were measured. Next, a CMP pad was produced by subjecting the polishing layer to a grooving process and a lamination process, and then the CMP polishing performance thereof was evaluated.

Comparative Examples 2 and 3

Polishing pads were produced in the same manner as in Comparative Example 1, except that the type and content of the solid foaming agent used in Comparative Example 1 were changed.

The components and contents used in the production of the polishing pads of the Examples and the Comparative Examples are shown in Table 1 below.

TABLE 1

| | | | Example 1 | Example 2 | Comparative Example 1 | Comparative Example 2 | Comparative Example 3 |
|---|---|---|---|---|---|---|---|
| Polishing layer | NCO content (%) of prepolymer | | 9% | 9% | 9% | 9% | 9% |
| | Casting mold type | | Piece | Piece | Piece | Piece | Piece |
| | Solid foaming agent used | Type | 551DU40 (Unexpanded) | 461DU40 (Unexpanded) | 031DU40 (Unexpanded) | 031DU40 (Unexpanded) | 043DU80 (Unexpanded) |
| | | Content (based on 100 parts by weight of prepolymer) | 5 | 5 | 1 | 3 | 3 |

TABLE 1-continued

| | | Example 1 | Example 2 | Comparative Example 1 | Comparative Example 2 | Comparative Example 3 |
|---|---|---|---|---|---|---|
| | sheet processing (casting, cutting, and grooving) | Sequential | Sequential | Sequential | Sequential | Sequential |
| | Prepolymer (parts by weight) | 100 | 100 | 100 | 100 | 100 |
| Casting | Curing time (Gel Time, sec) | 80 | 88 | 100 | 102 | 103 |

The results of summarizing the characteristics of the used solid foaming agents are shown in Table 2 below.

TABLE 2

| Solid foaming agent used | 551DU40 (Unexpanded) | 461DU40 (Unexpanded) | 031DU40 (Unexpanded) | 043DU80 (Unexpanded) |
|---|---|---|---|---|
| Particle size (before foaming, μm) | 9 to 15 | 9 to 15 | 10 to 16 | 16 to 24 |
| Tstart (° C.) | 94 to 99 | 100 to 107 | 80 to 95 | 95 to 115 |
| Tmax (° C.) | 141 to 149 | 144 to 152 | 120 to 135 | 147 to 167 |
| pH value | 3 to 4 | 3 to 4 | 9 to 11 | 9 to 11 |

Experimental Example 1

Evaluation of Physical Properties of Polishing Layers

The hardness, elongation, tensile strength and specific gravity of the polishing pad produced in each of the Examples and the Comparative Examples were measured in the following manner, and the results of the measurement are shown in Table 3 below. In addition, the content of Mg contained in the polishing layer by the use of the solid foaming agent was also measured.

(1) Hardness

The shore D hardness of the polishing pad produced in each of the Examples and the Comparative Examples was measured. Specifically, each polishing pad was cut to a size of 2 cm×2 cm (thickness: 2 mm), and then left to stand for 16 hours in an environment with a temperature of 25° C. and a humidity of 50±5%. Next, the hardness of each polishing pad was measured using a hardness meter (D-type hardness meter).

(2) Elongation

For each of the polishing pads produced in the Examples and the Comparative Examples, the maximum deformation immediately before breakage was measured while testing was performed using a universal testing machine (UTM) at a speed of 500 mm/min. Then, the ratio of the maximum deformation to the initial length was expressed as a percentage (%).

(3) Tensile Strength

For each of the polishing pads produced in the Examples and the Comparative Examples, the maximum strength value immediately before breakage was measured while testing was performed using a universal testing machine (UTM) at a speed of 500 mm/min. Then, through the measured value, the slope in the region corresponding to 20 to 70% of the strain-stress curve was calculated.

(4) Specific Gravity

The specific gravity of the polishing pad produced according to each of the Examples and Comparative Examples was measured. Each polishing pad was cut to a size of 2 cm×2 cm (thickness: 2 mm) and then left to stand in an environment with a temperature of 25° C. and a humidity of 50±5% for 16 hours. Next, the initial weight and the weight when immersed in water were measured using an electronic densimeter, and then the density was calculated.

(5) Measurement of Mg Content

Each polishing pad was pretreated using micro wave digestion (Anton Paar Multiwave PRO). Specifically, each prepared polishing layer sample was placed in a tube, and then a strong acid (a mixture of hydrochloric acid and nitric acid) was added thereto. Thereafter, the sample was digested and pretreated.

The Mg content in the pretreated sample was measured by ICP-OES measurement. Specifically, the measurement was performed using Agilent's 5900, plasma 12 and Purges Polychromator at a pump speed of 12 rpm and an Isomist temperature of 25° C.

TABLE 3

| | | Evaluation item | Example 1 | Example 2 | Comparative Example 1 | Comparative Example 2 | Comparative Example 3 |
|---|---|---|---|---|---|---|---|
| Physical properties | Top pad | Thickness (mm) | 2 | 2 | 2 | 2 | 2 |
| | | Hardness (Shore D) | 58.3 | 57.8 | 60 | 57.7 | 58.1 |
| | | Specific gravity (g/cc) | 0.78 | 0.78 | 0.85 | 0.78 | 0.78 |
| | | Tensile strength ($N/mm_2$) | 21.7 | 21.5 | 23.5 | 22.1 | 20.9 |

TABLE 3-continued

| Evaluation item | Example 1 | Example 2 | Comparative Example 1 | Comparative Example 2 | Comparative Example 3 |
|---|---|---|---|---|---|
| Elongation (%) | 97.1 | 97.2 | 80 | 95.6 | 96.6 |
| Thickness (mm) | 1.1 | 1.1 | 1.1 | 1.1 | 1.1 |
| Hardness (C) | 70 | 70 | 70 | 70 | 70 |
| Mg content (ppm) in polishing layer | 0.1 | 0.1 | 94 | 201 | 305 |

Referring to Table 3 above, it can be confirmed that the results of evaluation of the physical properties of the polishing layers did not greatly differ between the Examples and the Comparative Examples and were within similar ranges.

Experimental Example 2

Measurement of Pore Size in Polishing Layer

The size of pores in the polishing layer of each of the Examples and the Comparative Examples was measured. Specifically, the cross-section of a 1 $mm^2$ (1 mm×1 mm) square sample (thickness: 2 mm) obtained by cutting each polishing layer was imaged using a scanning electron microscope (SEM) at 100× magnification. The diameters of all pores on the obtained images were measured using image analysis software, and the number average diameter of pores, the distribution of the sum of the cross-sectional areas for each pore diameter, the number of pores, and the total area of pores were obtained. The width/length of the 100× SEM image was 959.1 μm/1,279 μm.

The results of the measurement are shown in Table 4 below.

TABLE 4

|  | Example 1 | Example 2 | Comparative Example 1 | Comparative Example 2 | Comparative Example 3 |
|---|---|---|---|---|---|
| D10 | 13.395 | 15.93 | 26.126 | 26.579 | 41.941 |
| D20 | 15.857 | 18.1 | 32.433 | 32.599 | 48.077 |
| D30 | 17.105 | 19.58 | 36.981 | 36.483 | 54.336 |
| D40 | 18.062 | 20.55 | 40.158 | 38.364 | 60.219 |
| D50 | 18.908 | 21.62 | 44.487 | 40.809 | 63.545 |
| D60 | 19.582 | 22.72 | 49.623 | 42.348 | 67.601 |
| D70 | 20.461 | 23.75 | 52.714 | 48.213 | 71.968 |
| D80 | 21.576 | 24.79 | 54.06 | 53.476 | 75.643 |
| D90 | 23.478 | 27.18 | 64.562 | 56.56 | 90.918 |
| D100 | 31.206 | 50.94 | 84.968 | 63.516 | 98.891 |
| Mg content | 1 or less | 1 or less | 94 | 201 | 305 |
| D10/D50 | 0.71 | 0.74 | 0.59 | 0.65 | 0.66 |
| Standard deviation | 4.63 | 9.34 | 16 | 11 | 17 |

(unit: μm)

As a result of measuring the pore size of each polishing layer, it was confirmed that the polishing layers of Examples 1 and 2 had D50 values of 18.908 μm and 21.62 μm, respectively, which are smaller than those of Comparative Examples 1 to 3, and had standard deviation values of 4.63 and 9.34, respectively, for D10 to D100, suggesting that pores were formed within a uniform size range.

In addition, as a result of analyzing the SEM images for the polishing layers, it can be confirmed that, in the case of Examples 1 and 2, small pores had a uniform size distribution, and in the case of Comparative Examples 1 to 3, the formed pores had a non-uniform size distribution.

Experimental Example 3

Evaluation of Polishing Performance of Polishing Pad (1) Measurement of Removal Rate Silicon dioxide ($SiO_2$) was deposited on a silicon wafer having a diameter of 300 mm by a chemical vapor deposition (CVD) process. The silicon wafer was placed over a CMP device, and then set onto a surface plate, to which the polishing pad of each of the Examples and the Comparative Examples was attached, such that the silicon oxide layer of the silicon wafer faced down. Thereafter, the polishing load was adjusted to 4.0 psi, and the silicon dioxide layer was polished by rotating the surface plate at 150 rpm for 60 seconds while supplying a calcined ceria slurry at a rate of 250 ml/min onto the polishing pad while rotating the polishing pad at 150 rpm.

After polishing, the silicon wafer was detached from the carrier, mounted on a spin dryer, washed with purified water (DIW), and then dried with nitrogen for 15 seconds. For the dried silicon wafer, the layer thickness change between before and after polishing was measured using an optical interference type thickness-measuring instrument (model: SI-F80R, Keyence). Then, the removal rate of the silicon wafer was calculated using the following Equation 3:

$$\text{Removal rate} = \text{polished thickness (Å) of silicon wafer} / \text{polishing time (50 sec)} \quad \text{[Equation 3]}$$

(2) Measurement of Polishing Pad Cut-Rate (μm/Hr)

The polishing pad including the polishing layer of each of the Examples and the Comparative Examples was preconditioned with deionized water for 10 minutes, and then conditioned for 1 hour while deionized water was sprayed thereto. The change in the thickness during 1 hour of conditioning was measured. The system used for conditioning was AP-300HM (CTS Co., Ltd.), the conditioning pressure was 6 lbf, the rotating speed was 100 to 110 rpm, and the disk used for conditioning was CI-45 (Sasol Co., Ltd.).

(3) Measurement of Defects

Polishing was performed in the same manner as the removal rate measurement method described in (1) above. After polishing, the silicon wafer was moved to a cleaner and cleaned with a mixture of 1% hydrogen fluoride (HF) and purified water (DIW) for 10 seconds and with a mixture of 1% nitric acid ($H_2NO_3$) and purified water (DIW) for 10 seconds. Then, the silicon wafer was transferred into a spin dryer, cleaned with purified water (DIW), and then dried with nitrogen for 15 seconds. For the dried silicon wafer, the change in defects between before and after polishing was measured using a defect measuring instrument (Tenkor, model: XP+).

(4) Calculation by Equation 1

Using the result of measurement of defects after polishing, the Mg content in the polishing layer and the calculated removal rate of the silicon dioxide layer, the value of Equation 1 was determined.

$$0 \leq \frac{DS \times D_{Mg}}{RR} \leq 1.5 \quad \text{[Equation 1]}$$

wherein

DS represents the number of defects and scratches, measured after performing the polishing process on a silicon oxide layer using a CMP polishing apparatus under a polishing load of 4.0 psi for 60 seconds while injecting a calcined ceria slurry at a rate of 250 ml/min and rotating a surface plate having the polishing pad attached thereto at a speed of 150 rpm;

RR represents the removal rate (Å/min) of the silicon oxide layer during the polishing process;

$D_{Mg}$ is the content (ppm) of Mg based on the total weight of the polishing layer; and $DS \times D_{Mg}/RR$ is the ratio between the values excluding units.

The results are shown in Table 5 below.

TABLE 5

| SMPL | | Example 1 | Example 2 | Comparative Example 1 | Comparative Example 2 | Comparative Example 3 |
|---|---|---|---|---|---|---|
| Ceria slurry | Ox RR (Å/min) | 2,718 | 2,919 | 2,833 | 2,989 | 3,302 |
| | Cut rate (μm/hr) | 19.4 | 19.2 | 22.0 | 20.4 | 21.1 |
| Defects/scratches | | 0 | 2 | 48 | 112 | 252 |
| Mg content (ppm) in top pad | | 0.1 | 0.1 | 94 | 201 | 305 |
| Equation 1 | | 0 | 0.0001 | 1.593 | 7.532 | 23.277 |

From the above experimental results, it was confirmed that the removal rate of the oxide layer and the cut rate of the polishing layer did not greatly differ between the Examples and the Comparative Examples, suggesting that there was no difference in polishing performance between the Examples and the Comparative Examples.

However, it was confirmed that the number of defects due to the polishing process was zero or very small (two) in the polishing layers of Examples 1 and 2, whereas a large number of defects/scratches appeared in the polishing layers of the Comparative Examples.

Although preferred embodiments of the present invention have been described in detail above, the scope of the present invention is not limited thereto, and various modifications and improvements made by those skilled in the art without departing from the basic concept of the present invention as defined by the appended claims also fall within the scope of the present invention.

What is claimed is:

1. A polishing pad comprising a polishing layer, wherein the polishing layer comprises a cured product of a prepolymer composition containing a polyurethane-based prepolymer, wherein the polyurethane-based prepolymer has a weight-average molecular weight (Mw) of about 500 g/mol to about 3,000 g/mol, wherein a viscosity of the prepolymer composition is from 100 cps to 1,000 cps at 80° C., wherein the polishing layer contains: a plurality of micropores each having a shell; and an inorganic component, wherein the shell is derived from an expandable solid foaming agent, wherein the micropores have a value of 0.7 to 0.8 as calculated according to the following ratio:

$$\frac{D10}{D50}$$

wherein

D10 represents a diameter of pores in a 10% volume cumulative distribution, and

D50 represents a diameter of pores in a 50% volume cumulative distribution, wherein the micropores have a standard deviation of 4 to 10 for measured values of D10 to D100, and wherein the inorganic component is Mg and is contained in an amount of 0.01 to 1 ppm based on the total weight of the polishing layer.

2. The polishing pad of claim 1, wherein the polishing layer satisfies the following equation:

$$0 \leq \frac{DS \times D_{Mg}}{RR} \leq 1.5$$

wherein

DS represents the number of defects and scratches, measured after performing a polishing process on a silicon oxide layer using a CMP polishing apparatus under a polishing load of 4.0 psi for 60 seconds while injecting a calcined ceria slurry at a rate of 250 ml/min and rotating a surface plate having the polishing pad attached thereto at a rotating speed of 150 rpm;

RR represents a removal rate (A/min) of the silicon oxide layer during the polishing process;

DMg is a content (ppm) of Mg based on the total weight of the polishing layer; and DS×DMg/RR is a ratio between values excluding units.

3. The polishing pad of claim 1, wherein a D50 of the micropores is 15 μm to 40 μm.

4. The polishing pad of claim 1, wherein the expandable solid foaming agent has a pH of 8 or less.

5. The polishing pad of claim 1, wherein the expandable solid foaming agent has a particle diameter of 9 μm to 24 μm before foaming.

6. The polishing pad of claim 1, wherein the expandable solid foaming agent comprises magnesium hydroxide ($Mg(OH)_2$).

7. The polishing pad of claim 1, wherein an expansion start temperature of the expandable solid foaming agent is 80° C. to 120° C.

8. The polishing pad of claim 1, wherein the expandable solid foaming agent is thermally expanded, and the thermally expanded solid foaming agent has a particle size of 5 μm to 100 μm.

9. The polishing pad of claim 1, wherein the shell comprises at least one selected from the group consisting of a vinylidene chloride-based copolymer, an acrylonitrile-based copolymer, a methacrylonitrile-based copolymer, and an acrylic copolymer.

10. The polishing pad of claim 1, wherein, when a polishing process is performed on a silicon oxide layer using a CMP polishing apparatus under a polishing load of 4.0 psi for 60 seconds while injecting a calcined ceria slurry at a rate of 250 ml/min and rotating a surface plate having the polishing pad attached thereto at a rotating speed of 150 rpm, a removal rate of the silicon oxide layer by the polishing process is 2,000 to 4,000 Å/min.

11. The polishing pad of claim 1, wherein the polishing pad exhibits a cut rate of 20 μm/hr or less, which is a change in thickness during a process in which the polishing pad is conditioned under a pressure of 6 lbf at a rotating speed of 100 to 110 rpm for 1 hour while deionized water is sprayed thereto for 1 hour after the polishing pad is initially preconditioned with deionized water for 10 minutes.

* * * * *